United States Patent
Tanzawa et al.

(10) Patent No.: US 7,957,214 B2
(45) Date of Patent: **\*Jun. 7, 2011**

(54) ADJUSTABLE VOLTAGE REGULATOR FOR PROVIDING A REGULATED OUTPUT VOLTAGE

(75) Inventors: Toru Tanzawa, Tokyo (JP); Peter B. Harrington, Gilbert, AZ (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/833,692

(22) Filed: Jul. 9, 2010

(65) Prior Publication Data

US 2010/0270994 A1    Oct. 28, 2010

Related U.S. Application Data

(63) Continuation of application No. 12/324,375, filed on Nov. 26, 2008, now Pat. No. 7,764,563.

(51) Int. Cl.
*G11C 5/14* (2006.01)
(52) U.S. Cl. ............... 365/226; 365/189.09; 365/185.23
(58) Field of Classification Search .................. 365/226, 365/189.09, 185.23
See application file for complete search history.

(56) References Cited

U.S. PATENT DOCUMENTS

| | | | | |
|---|---|---|---|---|
| 7,139,203 | B2 | 11/2006 | Huber | 365/189.05 |
| 7,277,355 | B2 | 10/2007 | Tanzawa | 365/230.06 |
| 7,577,043 | B2 * | 8/2009 | Chou et al. | 365/189.09 |
| 2010/0128551 | A1 | 5/2010 | Tanzawa et al. | 365/226 |

OTHER PUBLICATIONS

Ryu Ogiwara et al.; "*A 0.5 μm, 3-V, 1T1C, 1-Mbit FRAM with a Variable Reference Bit-Line Voltage Scheme using a Fatigue-Free Reference Capacitor*"; IEEE Journal of Solid-State Circuits; vol. 35; No. 4; Apr. 2000; pp. 545-551.

Toru Tanzawa et al.; "*Wordline Voltage Generating System for Low-Power Low-Voltage Flash Memories*"; IEEE Journal of Solid-State Circuits; vol. 36; No. 1; Jan. 2001; pp. 55-63.

Toru Tanzawa et al.; "*A 44-mm² Four-Bank Eight-Word Page-Read 64-Mb Flash Memory with Flexible Block Redundancy and Fast Accurate Word-Line Voltage Controller*"; IEEE Journal of Solid-State Circuits; vol. 37; No. 11; Nov. 2002; pp. 1485-1492.

Robert J. Milliken et al.; "*Full On-Chip CMOS Low-Dropout Voltage Regulator*"; IEEE Journal of Solid-State Circuits and Systems-I; Regular Papers; vol. 54, No. 9; Sep. 2007; pp. 1879-1890.

\* cited by examiner

*Primary Examiner* — Son Dinh
*Assistant Examiner* — Nam T Nguyen
(74) *Attorney, Agent, or Firm* — Dorsey & Whitney LLP (57) ABSTRACT

Voltage regulators, memories, and methods for providing a regulated output voltage are disclosed. For example, one such voltage regulator includes a comparator circuit, a driver circuit, an impedance circuit, and a modulation circuit. The comparator circuit generates an output voltage according to a difference between a reference voltage and a feedback voltage. The driver circuit is coupled to an output of the comparator circuit and drives the regulated output voltage at an output node according to the output voltage from the comparator circuit. The impedance circuit is coupled to the comparator circuit and provides the feedback voltage to the comparator circuit in response to a detection current from the output node. The modulation circuit is coupled to the impedance circuit and adjusts a modulation current component of the detection current to adjust the regulated output voltage.

28 Claims, 5 Drawing Sheets

ADJUSTABLE VOLTAGE REGULATOR FOR PROVIDING A REGULATED OUTPUT VOLTAGE

CROSS-REFERENCE TO RELATED APPLICATION(S)

This application is a continuation of U.S. patent application Ser. No. 12/324,375, filed Nov. 26, 2008, and issued as U.S. Pat. No. 7,764,563 B2 on Jul. 27, 2010. This application and patent are each incorporated herein by reference, in their entirety, for any purpose.

TECHNICAL FIELD

Embodiments of the invention relate generally to voltage regulator circuits, and in one or more particular embodiments, to voltage regulator circuits providing a regulated output voltage that can be adjusted continuously or in discrete increments.

BACKGROUND OF THE INVENTION

Voltage regulators are circuits that are used to provide a regulated voltage. The regulated voltage can be provided for use by other circuitry. For example, voltage regulators are included in integrated circuits, such as volatile and non-volatile semiconductor memory, to provide regulated internal voltages to circuitry used during operation. The voltage (and/or current) demands made by the circuitry may place varying demand on the regulated voltage, which can cause the magnitude of the regulated voltage to vary as well. Additionally, the voltage of the power supply to which the voltage regulator is coupled may vary due to noise, or may be susceptible to changing temperature conditions of the circuits. The voltage regulator, however, is designed to adjust to the varying need and changes so that the regulated output voltage maintains a relatively stable voltage level.

Figure 1:
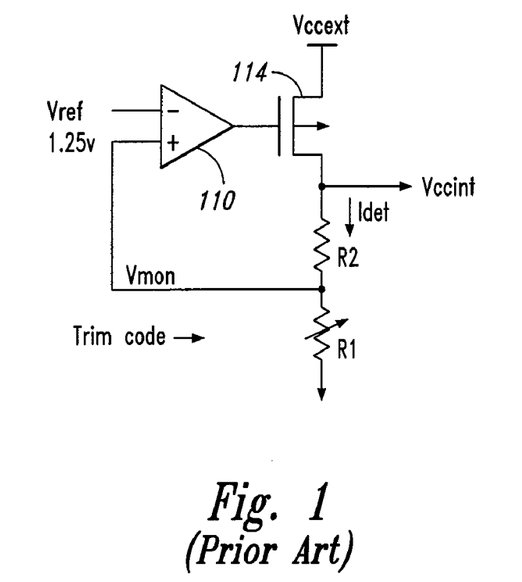
FIG. 1 is a schematic drawing of a conventional voltage regulator.

FIG. 1 illustrates a conventional voltage regulator 100 for providing a regulated output voltage Vccint. The voltage regulator 100 includes a differential amplifier 110 providing an output voltage based on the voltage difference between a reference voltage Vref and a feedback-monitored voltage Vmon. The output of the differential amplifier 110 is coupled to a gate of a p-channel transistor 114 that drives the Vccint voltage in accordance with the output voltage of the differential amplifier 110. Resistances R1 and R2 are coupled in series to the drain of the p-channel transistor 114. The resistance R1, which adjustable by a trim code, is used to set the voltage magnitude of the Vccint voltage. In particular, for the voltage regulator 100 Vccint=(1+R2/R1)×Vref. The trim code adjusts the resistance, and consequently, the magnitude of the Vccint voltage, by discrete amounts. The resistances R1, R2 further provide the Vmon voltage fed back to the differential amplifier 110.

In operation, the magnitude of the Vccint voltage is monitored through a feedback loop providing the Vmon voltage to the differential amplifier 110. In response, the differential amplifier 110 varies the conductivity of the p-channel transistor 114 that drives the Vccint voltage in accordance with the difference between the Vmon voltage and the Vref voltage. When the Vmon voltage is less than the Vref voltage, the differential amplifier 110 provides a voltage to the gate of the p-channel transistor 114 to be more conductive, thereby driving the Vccint voltage to a higher level. Conversely, when Vmon voltage is greater than the Vref voltage, the differential amplifier 110 provides a voltage to the gate of the p-channel transistor 114 to reduce the Vccint voltage. In this manner, the Vccint voltage can be regulated to provide a relatively constant output voltage. The magnitude of the regulated output voltage can be changed by adjusting the resistance of the resistance R1. In particular, increasing the resistance R1 reduces the magnitude of Vccint and decreasing the resistance R1 increases the magnitude of Vccint.

As previously discussed, the adjustable resistance R1 can be adjusted using a trim code to set the regulated output voltage level. A detection current Idet that flows through the resistances R1, R2 varies with changes in the resistance R1. For example, a higher resistance setting results in a decreased Idet current, and conversely, a lower resistance setting results in an increased Idet current. As a result, with a higher resistance setting (and lower Idet), the rate at which a voltage change in Vccint is reflected in the Vmon voltage is slower, in part due to the greater overall impedance resulting from the increased resistance. As a result, the response time of voltage regulator 100 is affected by changes in the resistance R1. The response time is generally a measure of how quickly a change in the Vccint voltage is reflected in the Vmon voltage, and as a result, how quickly the voltage regulator 100 can respond to changes in the Vccint voltage, such as when there is a surge in the voltage (and/or current) demand for the Vccint voltage. It is desirable for the voltage regulator 100 to be able to respond quickly enough to changes in demand such that operation of the system in which the voltage regulator 100 is included is not compromised.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 2:
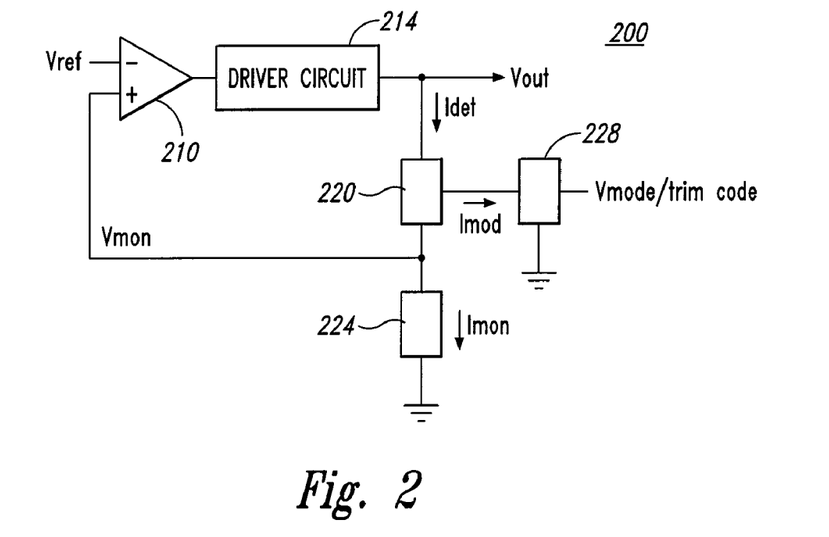
FIG. 2 is a block diagram of a voltage regulator according to an embodiment of the invention.

FIG. 2 illustrates a voltage regulator 200 according to some embodiments of the invention. The voltage regulator 200 includes a comparator 210, such as a differential amplifier, operational amplifier, or the like, providing an output voltage based on the voltage difference between a reference voltage Vref and a feedback-monitored voltage Vmon. The output voltage is provided to a driver circuit 214 that drives a regulated output voltage Vout in accordance to the output voltage of the comparator 210. Impedance circuits 220 and 224 are coupled to the output of the driver circuit 214, and generate the Vmon voltage that is fed back to the comparator 210. Although shown in FIG. 2 as two separate impedance circuits, in some embodiments the impedance circuits 220, 224 can be included in a single impedance circuit coupled between the output of the driver circuit 214 and a reference node, such as ground. A modulation circuit 228 is coupled to the impedance circuit 220. As will be described in more detail below, variation of a Imon current through the impedance circuit 224, and consequently, the variation of the Vmon voltage fed back to the comparator 210, is mitigated by the modulation circuit 228. The detection current Idet in the voltage regulator 200 is divided into Imod and Imon current components. In particular $$Idet=Imod+Imon.$$

In the conventional voltage regulator 100 (FIG. 1), the Idet current flows through both resistances 220 and 224 and can vary due to different resistance settings of the adjustable resistance 224. As previously discussed, the response time for the voltage regulator 100 may be affected to a undesirable degree. In contrast, however, the current that generates the Vmon voltage for the voltage regulator 200, that is, the Imon current, is less susceptible to variability resulting from changes in the Idet current due to the Imod current component modulation used to adjust the regulated output voltage. As a result, the Vmon voltage monitored by the comparator circuit 210 is less influenced by changes in the Idet current and the voltage regulator 200 has a more consistent response time.

In some embodiments of the invention, the modulation circuit 228 provides an Imod current that may be changed in discrete increments. For example, in some of the embodiments of the invention, the modulation circuit 228 receives a digital trim code that when changed effects the Imod current in discrete amounts. In some embodiments, the modulation circuit 228 provides an Imod current that may be changed continuously according to a control signal. For example, the modulation circuit 228 can adjust the Imod current over a continuous range of currents according to a bias voltage Vmod.

In some embodiments, the driver circuit 214 is implemented as a conventional oscillator and charge pump circuit, where the oscillator is activated and deactivated based on the voltage of Vmon relative to Vref. For example, during the time the Vmon voltage is less than the Vref voltage, the comparator 210 outputs a signal that activates operation of the oscillator. As a result, an oscillating output signal provided by the activated oscillator drives the charge pump circuit to generate an output voltage Vout from voltage regulator 200. When the Vmon exceeds the Vref voltage, for example, due to the increasing Vout voltage driven by the charge pump circuit, the comparator 210 outputs a signal that deactivates operation of the oscillator which ceases to provide the oscillating output signal to the charge pump circuit. As a result, the charge pump circuit ceases to continue driving the Vout voltage of the voltage regulator 200. When the Vmon voltage decreases to less than the Vref voltage, the oscillator is again activated to drive the charge pump circuit, which in turn drives the Vout voltage.

Figure 3:
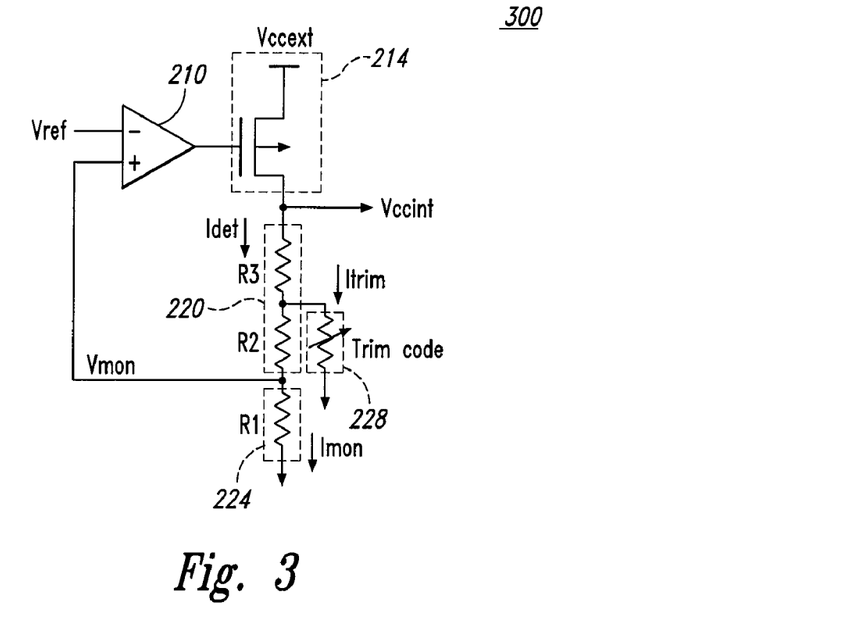
FIG. 3 is a schematic drawing of a voltage regulator according to an embodiment of the invention.

FIG. 3 illustrates a voltage regulator 300 according to an embodiment of the invention. The driver circuit 214 includes a p-channel transistor having a gate coupled to receive the output voltage of the comparator 210. The impedance circuit 224 includes resistance R1 and the impedance circuit 220 includes resistances R2 and R3. The modulation circuit 228 includes a variable resistance Rtrim, that has a resistance set according to a trim code. In the embodiment of FIG. 3, the Idet current includes Itrim and Imon current components. That is, Idet=Itrim+Imon, where the Itrim current component is the Imod current component shown in FIG. 2. The trim code is used to adjust the resistance of the modulation circuit 228 by discrete increments of resistance, which in effect, changes the Idet current by discrete increments.

In operation a trim code is applied to adjust the resistance of the modulation circuit 228. Changing the trim code adjusts the output voltage Vccint. For example, where the resistance of the modulation circuit 228 is reduced, the Vccint voltage will be increased. The change in resistance of the modulation circuit results in the Idet current changing. As previously discussed, however, the changed resistance effects the Itrim (Imod) current component of the Idet current more than the Imon component, which remains relatively stable in comparison to a changed Idet current that directly changes the feedback voltage of Vmon in the conventional voltage regulator 100 (FIG. 1). Since the Imon current is affected less by the changed Idet current, the Vmon voltage is less affected as well. The relatively stable Vmon voltage provides the benefit of having a response time that is less subject to variation due to changes of the Idet current when the modulation circuit is adjusted by the trim code.

Figure 4:
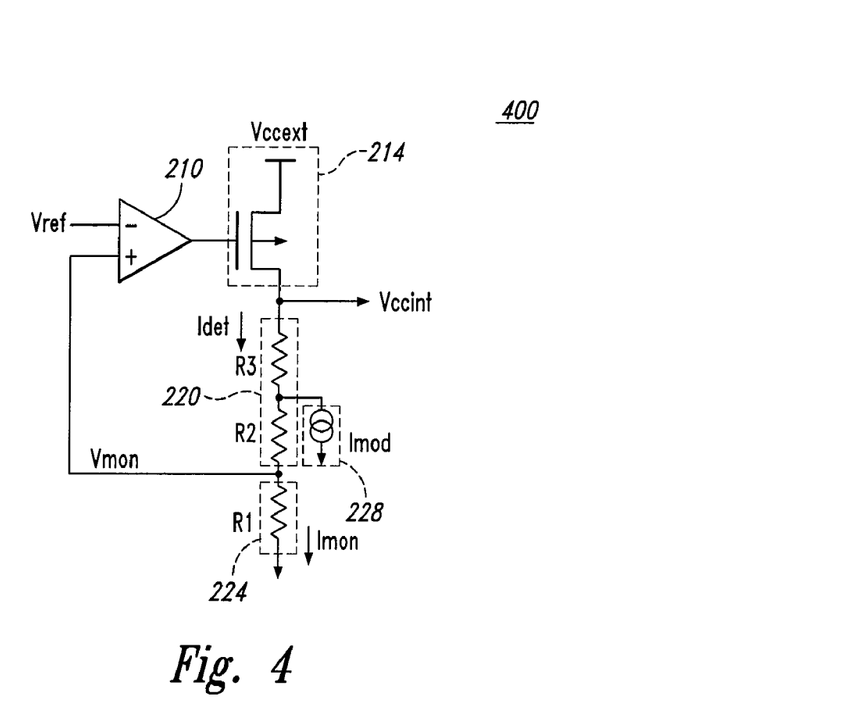
FIG. 4 is a schematic drawing of a voltage regulator according to an embodiment of the invention.

FIG. 4 illustrates a voltage regulator 400 according to an embodiment of the invention. The driver circuit 214 includes a p-channel transistor having a gate coupled to receive the output voltage of the comparator 210. The impedance circuit 224 includes resistance R1 and the impedance circuit 220 includes resistances R2 and R3. The modulation circuit 228 includes a current source providing an Imod current component. As previously discussed, the Idet current includes Imod and Imon current components. That is, Idet=Imod+Imon. Generally, Imon=Vref/R1.

In operation the current source of the modulation circuit 228 can be adjusted to change the Vccint voltage output by the voltage regulator 400. For example, where the current source is adjusted to increase Imod, the Vccint voltage will be increased. The change in the Imod current results in the Idet current changing. Although the Idet current changes to adjust the Vccint voltage, the Imon current is less affected by the change due to the Imod component. As a result, the Vmon voltage is less affected as well. The relatively stable Vmon voltage provides the benefit of having a response time that is less subject to variation due to changes of the Idet current when the Imod current of the modulation circuit 228 is adjusted to change the Vccint voltage output by the voltage regulator 400. In particular, the relationship between Vccint and Imod is:

$$Vccint=[(1+(R2+R3)/R1)\times Vref]+[R3\times Imod].$$

Although shown in FIGS. 3 and 4 as including resistances R2 and R3, in some embodiments of the invention the impedance circuit 220 includes one or more resistances. Also, in some embodiments of the invention, the modulation circuit 228 is coupled to the node from which the Vmon voltage is coupled to the comparator 210.

Figure 5:
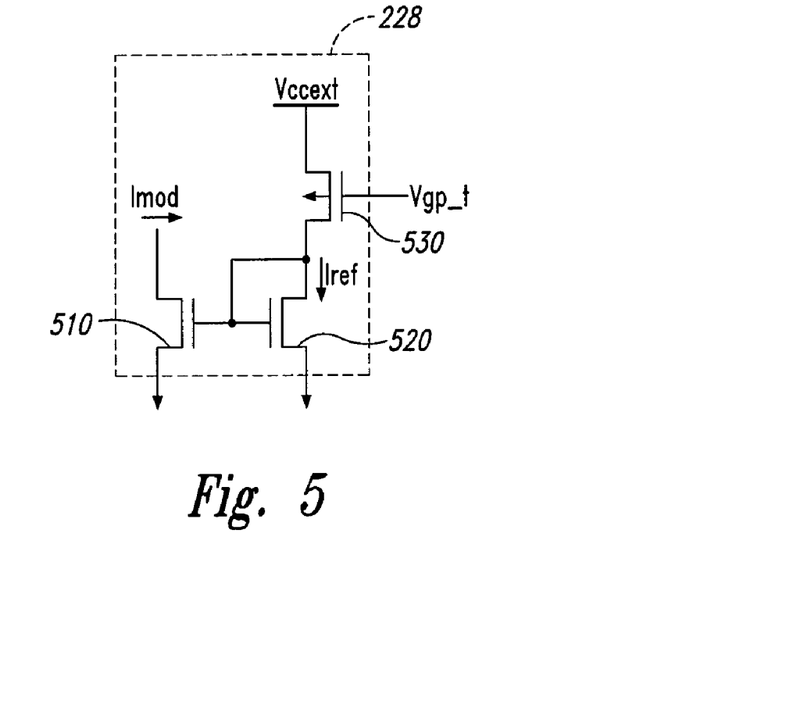
FIG. 5 is a schematic drawing of a voltage controlled current source according to an embodiment of the invention.

FIG. 5 illustrates a modulation circuit 228 according to an embodiment of the invention. The modulation circuit 228 of FIG. 5 is a voltage controlled current source, which may be used, for example, as the current source for the modulation circuit 228 of FIG. 4. The modulation circuit 228 of FIG. 5 includes a pair of gate coupled n-channel transistors 510, 520. The n-channel transistor 520 has a drain coupled to the common gate connection. A p-channel transistor 530 is coupled between the drain of the n-channel transistor and a voltage supply. The p-channel transistor 530 is used to provide a reference current Iref that can be adjusted according to a control voltage Vgp_t applied to the gate of the p-channel transistor 530. For example, in a voltage range of Vgp_t, the magnitude of Iref current is negatively related to the magnitude of the Vgp_t voltage. That is, as Vgp_t is decreased, the Iref current increases and as Vgp_t increases, the Iref current decreases. The Iref current is mirrored at the drain of the n-channel transistor 510 to provide an Imod current.

Figure 6A:
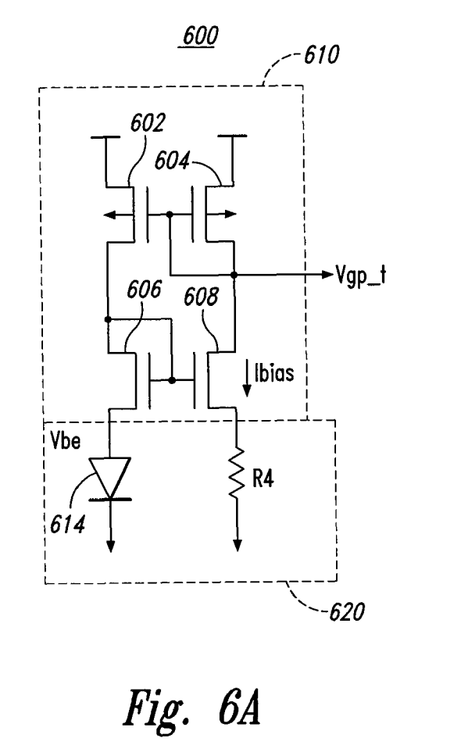
FIGS. 6A-6C are schematic drawings of bias circuits according to embodiments of the invention.
Figure 6B:
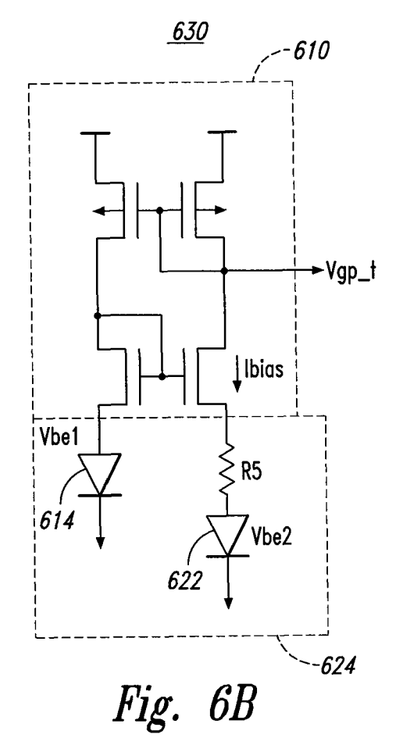
Figure 6C:
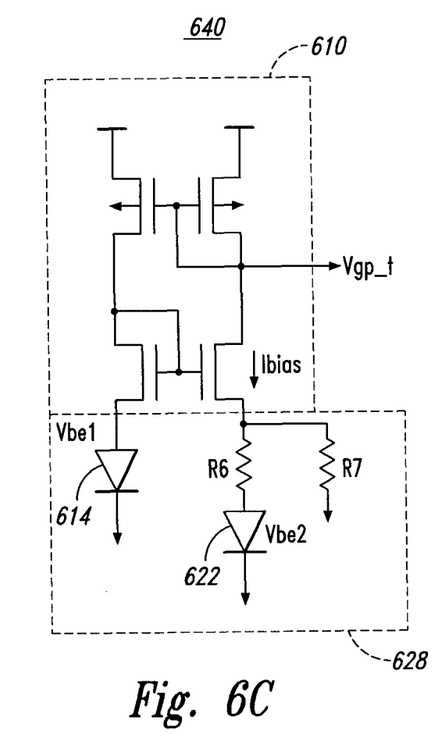

FIG. 6A-6C illustrate bias circuits according to embodiments of the invention. The bias circuit 600 of FIG. 6A includes a bias current source 610 that provide a bias current Ibias. The bias circuit 600 further includes a temperature dependent circuit 620 coupled to the bias current source 610. The temperature dependent circuit 620 includes a diode 614 and a resistance R4. The diode 614 provides a temperature dependent voltage Vbe across its terminals such that the Vbe voltage increases with an increase in temperature.

The bias circuit 600 is a temperature dependent bias circuit that outputs a Vgp_t voltage that varies positively with temperature. That is, as the temperature of the temperature dependent circuit 620 increases the magnitude of the Vgp_t voltage increases. In operation, the bias current Ibias of the 610 is based on the Vbe voltage and the R4 resistance. In particular, Ibias=Vbe/R4. Thus, as the temperature of the temperature dependent circuit 620 increases (increasing Vbe), the Ibias increases, which results in a higher Vgp_t. When the Vgp_t of the bias circuit 600 is applied as the bias voltage for a modulation circuit 228 having a current source such as that described with reference to FIG. 5, the Imod current varies negatively with temperature. That is, as the temperature of the temperature dependent circuit 620 increases, the Imod current decreases. As a result, when the Imod current is provided to a voltage regulator circuit, such as voltage regulator 400 of FIG. 4, the Vccint signal will vary negatively with temperature. In summary, the bias circuit 600 can be used to provide a temperature dependent control voltage, that can be used to adjust the Imod current, and consequently, adjust the Vccint voltage output to have a negative relationship with temperature.

The bias circuit 630 of FIG. 6B includes a bias current source 610 to provide a bias current Ibias. The bias circuit 600 further includes a temperature dependent circuit 624 coupled to the bias current source 610. The temperature dependent circuit 624 includes a diode 614, and a resistance R5 and a diode 622 coupled in series. The diodes 614 and 622 provide temperature dependent voltages Vbe1 and Vbe2, respectively, across the terminals such that the Vbe1 and Vbe2 voltages increase with an increase in temperature. In relation to one another, the Vbe1 voltage is greater than the Vbe2 voltage, and the rate of voltage change for Vbe2 is greater than Vbe1. As a result, as the temperature of the temperature dependent circuit 624 increases, the difference in voltage between the Vbe1 and Vbe2 voltages decreases.

The bias circuit 630 is a temperature dependent bias circuit that outputs a Vgp_t voltage that varies negatively with temperature. That is, as the temperature of the temperature dependent circuit 630 increases the magnitude of the Vgp_t voltage decreases. In operation, the bias current Ibias of the bias current source 610 is based on the Vbe1 and Vbe2 voltages, and the R5 resistance. In particular, Ibias=(Vbe1−Vbe2)/R5. Thus, as the temperature of the temperature dependent circuit 624 increases (increasing Vbe1 and Vbe2; Vbe1 is greater than Vbe2; Vbe2 has a greater rate of voltage change than Vbe1; the difference in voltage between the Vbe1 and Vbe2 voltages becomes less), the Ibias decreases, which results in a lower Vgp_t voltage. When the Vgp_t of the bias circuit 630 is applied as the bias voltage for a modulation circuit 228 having a current source such as that described with reference to FIG. 5, the Imod current varies positively with temperature. That is, as the temperature of the temperature dependent circuit 624 increases, the Imod current increases. As a result, when the Imod current is provided to a voltage regulator circuit, such as voltage regulator 400 of FIG. 4, the Vccint signal will vary positively with temperature. In summary, the bias circuit 630 can be used to provide a temperature dependent control voltage, that can be used to adjust the Imod current, and consequently, adjust the Vccint voltage output to have a positive relationship with temperature.

The bias circuit 640 of FIG. 6C includes a bias current source 610 to provide a bias current Ibias. The bias circuit 640 further includes a temperature dependent circuit 628 coupled to the bias current source 610. The temperature dependent circuit 624 includes a diode 614, resistance R6 and diode 622 coupled in series, and resistance R7. The diodes 614 and 622 provide temperature dependent voltages Vbe1 and Vbe2, respectively, across the terminals such that the Vbe1 and Vbe2 voltages increase with an increase in temperature. In relation to one another, the Vbe1 voltage is greater than the Vbe2 voltage, and the rate of voltage change for Vbe2 is greater than Vbe1.

The bias circuit 640 is a temperature dependent bias circuit that outputs a Vgp_t voltage that varies negatively or positively with temperature depending on the relative resistances of the R6 and R7 resistances. In operation, the bias current Ibias of the bias current source 610 is based on the Vbe1 and Vbe2 voltages, and the R6 and R7 resistances. In particular, Ibias=(Vbe1/R7)+(Vbe1−Vbe2)/R6. The first component (Vbe1/R7) of the Ibias current increases the Ibias current as temperature increases. The second components (Vbe1−Vbe2)/R6 of the Ibias current decreases the Ibias current as temperature decreases.

In operation, when the resistances R6>R7, the first Ibias component will be dominant and the Ibias current will generally vary positively with increasing temperature, resulting in a Vgp_t voltage that varies positively with increasing temperature. In contrast, when the resistances R6<R7, the second Ibias component will be dominant and the Ibias current will generally vary negatively with increasing temperature, resulting in a Vgp_t voltage that varies negatively with increasing temperature. When the Vgp_t of the bias circuit 640 is applied as the bias voltage for a modulation circuit 228 having a current source such as that described with reference to FIG. 5, the Imod current varies negatively with temperature when R6>R7, but varies positively with temperature when R6<R7. As a result, when the Imod current is provided to a voltage regulator circuit, such as voltage regulator 400 of FIG. 4, the Vccint signal will vary negatively with temperature when R6>R7, but vary positively with temperature when R6<R7.

Voltage regulators according to embodiments of the invention that provide a regulated voltage that can be adjusted in response to temperature, may be used in many applications. In some embodiments, such voltage regulators are used in non-volatile memory. For example, as known, memory cells are typically arranged in rows and columns in a memory array, with the memory cells of a row coupled to respective word line. During memory access, word lines of the array are driven to active or inactive word line voltages, with the word lines to be accessed driven to the active word line voltage. Voltage regulators according to embodiments of the invention that provide regulated voltages that can be adjusted in response to temperature can be used to provide the active and inactive word line voltages that are driven on word lines of the memory array. In this manner, adjusting the inactive and active word line voltages may be able to compensate for changes to memory performance due to shifts in device temperature.

Figure 7:
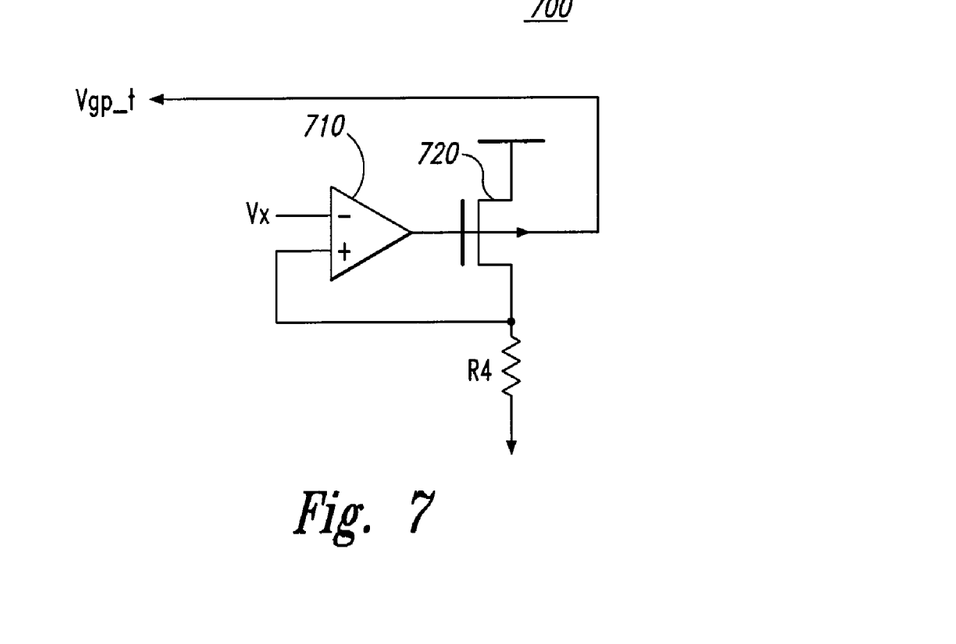
FIG. 7 is a schematic drawing of a bias circuit according to an embodiment of the invention.

FIG. 7 illustrates a bias circuit 700 according to an embodiment of the invention. The bias circuit 700 includes a voltage comparator 710 that generates an output voltage that is provided as a control voltage Vgp_t. The output voltage of the voltage comparator 710 is further applied to a gate of p-channel transistor 720. The bias circuit 700 further includes a resistance R4 that is used to provide a feedback voltage to an input of the comparator 710. The feedback voltage is compared to a examined voltage Vx. In operation, the bias circuit 700 provides a Vgp_t voltage that is based on the Vx voltage. In some embodiments, the Vx voltage is a voltage that can be changed by discrete increments, resulting in a Vgp_t voltage that changes in discrete increments. In some embodiments, the Vx voltage is a voltage that can be changed continuously, resulting in the Vgp_t voltage that changes continuously in response to the Vx voltage.

The bias circuit 700 can be used to provide the Vgp_t voltage to a modulation circuit 228, such as the embodiment described with reference to FIG. 5 having a voltage controlled current source, so that the Imod current will vary with the Vx voltage. In particular, the bias circuit 700 will result in an Imod current that varies negatively with increasing Vx voltage. Where the modulation circuit 228 is controlled by the bias circuit 700 to provide the Imod current as previously discussed, the Vccint output voltage will vary negatively with increasing Vx voltage. In particular, the relationship between Vccint and Vx is:

$$Vccint=[(1+(R2+R3)/R1) \times Vref]+[R3+(Vx/R4)].$$

Voltage regulators according to embodiments of the invention that provide a regulated voltage that is adjusted in response to an examined voltage, such as the Vx voltage previously described with reference to FIG. 7, may be used in many applications. In some embodiments, such voltage regulators are used in non-volatile memory. For example, in a non-volatile memory, groups of cells are coupled in series to a source line. During memory access operations, the voltage of the source line may deviate from an expected voltage level due to voltage effects from the series coupled memory cells being accessed. A voltage regulator providing a regulated voltage that is used to drive the inactive and active word lines of the memory array can be adjusted to change the magnitude of the regulated voltage according to changes in the source line voltage in order to compensate for the source line voltage shift and maintain an effective gate-source voltage during memory access.

Figure 8:
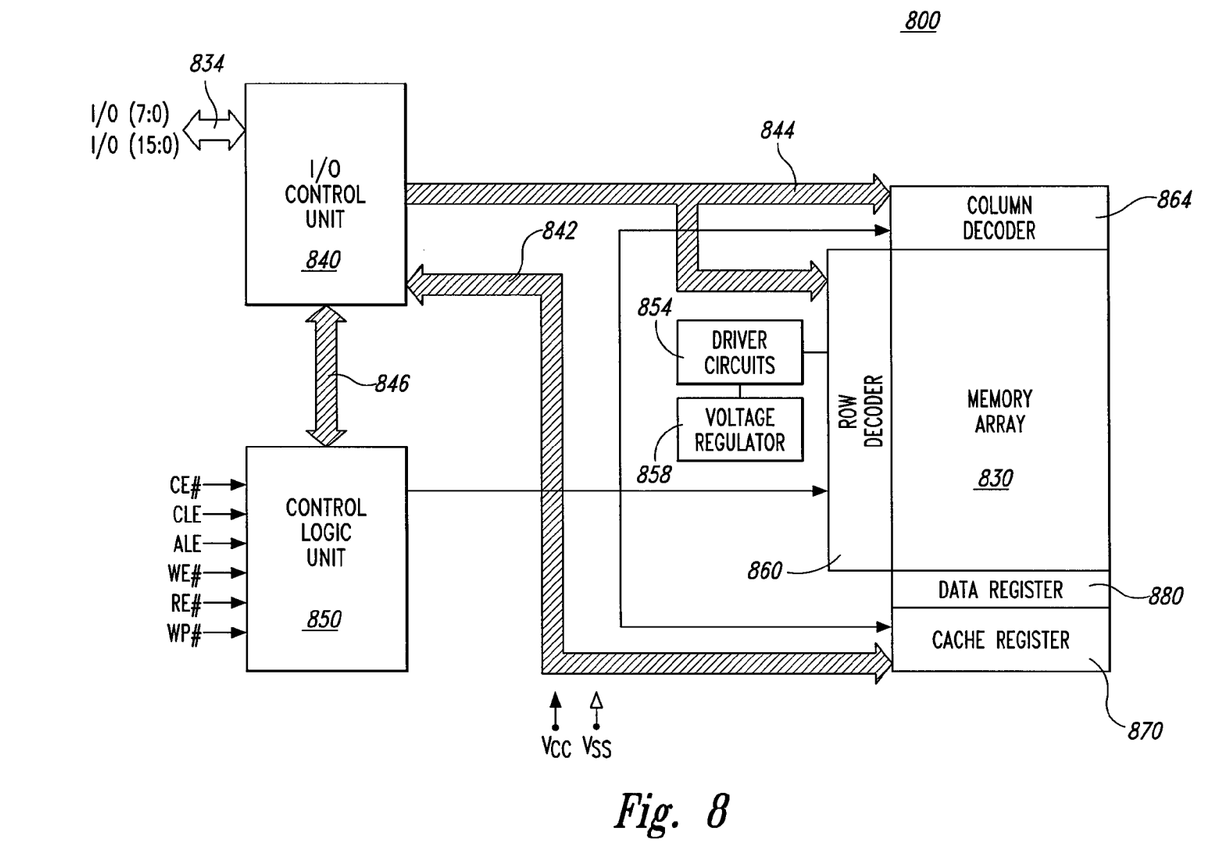
FIG. 8 is a block diagram of a memory having a voltage regulator according to an embodiment of the invention.

FIG. 8 illustrates a memory device 800 including a voltage regulator according to an embodiment of the invention, for example, such as voltage regulators previously described with reference to FIGS. 2-7. The memory device 800 includes an array 830 of memory cells arranged in rows and columns. In some embodiments, the memory cells are non-volatile memory cells. Embodiments of the present invention, however, may be practiced with different types of memory, including both volatile and non-volatile memory. The memory cells of a row are coupled to respective word lines that are driven to active or inactive voltage levels during access of the array 830 of memory cells.

Most command signals, the address signals and the write data signals are applied to the memory device 800 as sets of sequential input/output ("I/O") signals transmitted through an I/O bus 834. Similarly, read data signals are output from the memory device 800 through the I/O bus 834. The I/O bus is connected to an I/O control unit 840 that routes the signals between the I/O bus 834 and an internal data bus 842, an internal address bus 844, and an internal command bus 846. The memory device 800 also includes a control logic unit 850 that receives a number of control signals either externally or through the command bus 846 to control the operation of the memory device 800. The address bus 844 applies row address signals to a row decoder 860 and column address signals to a column decoder 864.

The row decoder 860 couples the active and inactive word line voltages from driver circuits 854 to word lines of the array 830 of memory cells to access the rows of memory corresponding to the row address signals. The appropriate voltage levels for the active and inactive word line voltages are provided to the driver circuits 854 by voltage regulator 858, which may include one or more voltage regulators according to embodiments of the invention. Moreover, in some embodiments of the memory device 800, the voltage regulators 858 may generate regulated voltages that are adjusted as previously discussed. For example, some regulated voltages may be adjusted positively or negatively to increasing temperature. Regulated voltages may also be adjusted according to an examined voltage.

The column decoder 864 receives the column address signals and enables write data signals to be applied to bit lines for columns corresponding to the column address signals. Read data signals are coupled from bit lines for columns corresponding to the column address signals. In response to the memory commands decoded by the control logic unit 850, the memory cells in the array 830 are erased, programmed, or read. The memory array 830 is programmed on a row-by-row or page-by-page basis. After the row address signals have been applied to the address bus 844, the I/O control unit 840 routes write data signals to a cache register 870. The write data signals are stored in the cache register 870 in successive sets each having a size corresponding to the width of the I/O bus 834. The cache register 870 sequentially stores the sets of write data signals for an entire row or page of memory cells in the array 830.

All of the stored write data signals are then used to program a row or page of memory cells in the array 830 selected by the row address coupled through the address bus 844. In a similar manner, during a read operation, data signals from a row or page of memory cells selected by the row address coupled through the address bus 844 are stored in a data register 880. Sets of data signals corresponding in size to the width of the I/O bus 834 are then sequentially transferred through the I/O control unit 840 from the data register 880 to the I/O bus 834.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A voltage regulator for providing a temperature-dependent regulated output voltage, the voltage regulator comprising:
   a comparator having a reference voltage input, a feedback input, and an output, the comparator configured to generate an output voltage in accordance with a comparison between a reference voltage applied to the reference voltage input and a feedback voltage applied to the feedback input;
   a driver coupled to the output of the comparator and an output node, the driver configured to receive the output voltage from the comparator and drive the regulated output voltage at the output node according to the output voltage from the comparator;

an impedance coupled to the comparator and the output node, the impedance configured to establish the feedback voltage applied to the feedback input of the comparator, based at least in part on a current through the impedance; and a modulator coupled to the impedance and configured to adjust the current through the impedance based, at least in part, on a temperature proximal to the modulator.

2. The voltage regulator of claim 1 wherein the comparator comprises an operational amplifier.

3. The voltage regulator of claim 1 wherein the driver comprises:

an oscillator configured to generate an oscillating output signal; and a charge pump coupled to the oscillator and configured to generate an output voltage signal responsive to the oscillating output signal.

4. The voltage regulator of claim 1 wherein the driver comprises a field-effect transistor.

5. The voltage regulator of claim 1 wherein the impedance comprises a plurality of series coupled resistors.

6. The voltage regulator of claim 1 wherein the impedance comprises a plurality of field-effect transistors.

7. The voltage regulator of claim 1 wherein the modulator comprises a variable resistor configured to provide a resistance according to a code.

8. The voltage regulator of claim 1 wherein the modulator comprises an adjustable current source.

9. The voltage regulator of claim 8 wherein the adjustable current source comprises a voltage controlled adjustable current source configured to provide a current having a magnitude based, at least in part, on a control voltage.

10. The voltage regulator of claim 9, further comprising a temperature-dependent circuit coupled to the voltage controlled current source and configured to generate the control voltage.

11. The voltage regulator of claim 10 wherein the temperature-dependent circuit is further configured to provide an increasing voltage in response to an increase in the temperature proximal to the modulator.

12. The voltage regulator of claim 10 wherein the temperature-dependent circuit is further configured to provide a decreasing voltage in response to an increase in the temperature proximal to the modulator.

13. A method for generating a regulated output voltage provided at an output node, comprising:

dividing a detection current from the output node into a modulation current component and a monitoring current component, the modulation current component for adjusting the voltage magnitude of the regulated output voltage;

generating a monitoring voltage from the monitoring current component;

comparing the monitoring voltage to a reference voltage and generating a control voltage based on the voltage difference between the monitoring voltage and the reference voltage; and driving the regulated output voltage according to the control voltage.

14. The method of claim 13, further comprising adjusting the modulation current component to adjust a magnitude of the regulated output voltage.

15. The method of claim 14 wherein adjusting the modulation current component comprises a variable resistance.

16. The method of claim 15 wherein selecting a value of a variable resistance comprises providing a trim code to a variable resistance circuit.

17. The method of claim 14 wherein adjusting the modulation current component comprises adjusting a current provided by an adjustable current source.

18. The method of claim 14 wherein adjusting the modulation current component comprises adjusting the modulation current component in accordance with a temperature.

19. The method of claim 14 wherein adjusting the modulation current component comprises adjusting the modulation current component in response to changes of an examined input voltage.

20. A memory, comprising:

a plurality of memory cells;

an address decoder coupled to the plurality of memory cells and configured to select memory cells of the plurality of memory cells for access according to memory addresses;

a data path coupled to the plurality of memory cells, the data path configured to couple read data from the plurality of memory cells and to couple write data to the plurality of memory cells;

at least one voltage driver circuit coupled to at least one of the plurality of memory cells and configured to provide a driving voltage; and a voltage regulator coupled to the at least one voltage driver circuit and configured to provide a temperature-dependent regulated output voltage, the voltage regulator comprising:

a comparator having a reference voltage input, a feedback input, and an output, the comparator configured to generate an output voltage in accordance with a comparison between a reference voltage applied to the reference voltage input and a feedback voltage applied to the feedback input;

a driver coupled to the output of the comparator and an output node, the driver configured to receive the output voltage from the comparator and drive the regulated output voltage at the output node according to the output voltage from the comparator;

an impedance coupled to the comparator and the output node, the impedance configured to establish the feedback voltage applied to the feedback input of the comparator, based at least in part on a current through the impedance; and a modulator coupled to the impedance and configured to adjust the current through the impedance based, at least in part, on a temperature proximal to the modulator.

21. The memory of claim 20 wherein the plurality of memory cells comprises memory cells arranged in rows and columns of memory cells and having word lines coupled to the rows of memory cells, the at least one voltage driver circuit coupled to the word lines and the voltage regulator configured to provide an active word line voltage to be driven by the at least one voltage driver circuit.

22. The memory of claim 21, further comprising a second voltage regulator coupled to the at least one voltage driver circuit and configured to provide an inactive word line voltage to be driven by the at least one voltage driver circuit.

23. The memory of claim 20 wherein the modulator of the voltage regulator comprises a variable resistor configured to provide a resistance according to a code.

24. The memory of claim 20 wherein the modulator of the voltage regulator comprises a voltage controlled current source configured to provide a current having a magnitude according to a control voltage.

25. The memory of claim 24, further comprising a bias coupled to the voltage controlled current source and configured to generate the control voltage.

26. The memory of claim 25 wherein the bias is further configured to provide an increasing voltage in response to an increase in the temperature proximal to the modulator.

27. The memory of claim 24 wherein the bias is further configured to provide a decreasing voltage in response to an increase in the temperature proximal to the modulator.

28. The memory of claim 25 wherein the bias is further configured to generate a control voltage for the current source having a voltage in response to changes of an examined input voltage.

* * * * *